United States Patent
Chen

(10) Patent No.: US 6,775,194 B2
(45) Date of Patent: Aug. 10, 2004

(54) STANDBY CURRENT REDUCTION CIRCUIT APPLIED IN DRAM

(75) Inventor: Chieng Chung Chen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 90 days.

(21) Appl. No.: 10/175,303

(22) Filed: Jun. 19, 2002

(65) Prior Publication Data

US 2003/0235104 A1 Dec. 25, 2003

(51) Int. Cl.$^7$ .............................................. G11C 13/00
(52) U.S. Cl. ..................... 365/203; 365/190; 365/205; 365/207; 365/208
(58) Field of Search ............................... 365/190, 203, 365/205, 207, 208, 229

(56) References Cited

U.S. PATENT DOCUMENTS 5,499,211 A * 3/1996 Kirihata et al. ............. 365/203
6,144,599 A * 11/2000 Akita et al. ................. 365/203

* cited by examiner

Primary Examiner—David Nelms
Assistant Examiner—Long Tran
(74) Attorney, Agent, or Firm—Ladas & Parry

(57) ABSTRACT

The present invention discloses a standby current reduction circuit applied in DRAM, which comprises a pre-charge circuit and a current-limiting means. The pre-charge circuit provides a pre-charge current to the pair of complementary bit lines of DRAM only in the operating mode. The current-limiting means provides only a small pre-charge current to the pair of complementary bit lines of DRAM. With the pre-charge current provided by the pre-charge circuit, it can reduce the pre-charge current required by the current-limiting means to supply, and further reduce the leakage current forming in the standby mode due to short circuit between the pair of complementary bit lines and the word line of DRAM.

8 Claims, 2 Drawing Sheets

STANDBY CURRENT REDUCTION CIRCUIT APPLIED IN DRAM

BACKGROUND OF THE INVENTION

1. Field of the Invention

The present invention related to a circuit for reducing the leakage current of DRAM, more particularly to a circuit for reducing the short DC standby current between the bit line and the word line of DRAM.

2. Background of the Invention

In the manufacturing process of DRAM, a short circuit between the bit line and the word line sometimes occurs and causes a leakage current and affect the product yield.

One of the solution for the above-mentioned problem is disclosed in U.S. Pat. No. 5,499,211, entitled "BIT-LINE PRE-CHARGE CURRENT LIMITER FOR CMOS DYNAMIC MEMORIES." As shown in FIG. 1, a conventional circuit 10 comprises a word line 12, a pair of complementary bit lines 13, a pre-charge equalizing circuit 14 and a current-limiting means 11. In prior art, in order to prevent an excess leakage current caused by the short circuit between the bit line (BL) and the word line (WL), a current-limiting means 11, such as a depletion NMOS, is added between a source of pre-charge voltage (VBLEQ) 15 and the pair of complementary bit lines 13 so as to limit the maximum leakage current when the short circuit between the bit line and the word line occurs.

Generally, the word line voltage ($V_{WL}$) is 0 volt in the standby mode, but the bit line voltage is larger than 0 volt. Thus, a leakage current path will be formed in the standby mode. The leakage current will flow from BLEQ, BL, WL to the ground. In other words, the conventional method cannot effectively reduce the leakage current when the short circuit between the bit line and the word line occurs. For the current application in the product for low power DRAM, the leakage current is still too large to satisfy the market requirement.

Regarding the problems in the prior art, the present invention provides an innovative standby current reduction circuit for the DRAM to overcome the above-mentioned disadvantages.

SUMMARY OF THE INVENTION

The object of the present invention is to provide a standby current reduction circuit for DRAM, which is suitable for the application requirement in a low power DRAM.

To this end, the present invention discloses a standby current reduction circuit for DRAM, which adds a pre-charge circuit between a pair of complementary bit lines of DRAM. The pre-charge circuit comprises a plurality of transistors in parallel or serial connection, which can generate a larger pre-charge current in an operating mode so as to relatively reduce the size of the current-limiting means and the resulting pre-charge current. Because the leakage current caused by the short circuit between the pair of complementary bit lines and the word line of DRAM usually comes from the pre-charge current of the current-limiting means, the present invention can reduce the standby current caused by the short circuit between the bit lines and the word line.

The standby current reduction circuit for DRAM according to the present invention comprises a pre-charge circuit and a current-limiting means. The pre-charge circuit provides a pre-charge current to the pair of complementary bit lines of DRAM only in the operating mode. The current-limiting means provides only a small pre-charge current to the pair of complementary bit lines of DRAM. With the pre-charge current provided by the pre-charge circuit, it can reduce the pre-charge current required by the current-limiting means to supply, and further reduce the leakage current forming in the standby mode due to short circuit between the pair of complementary bit lines and the word line of DRAM.

BRIEF DESCRIPTION OF THE DRAWINGS

The present invention will be described according to the appended drawings in which.

PREFERRED EMBODIMENT OF THE PRESENT INVENTION

Figure 1:
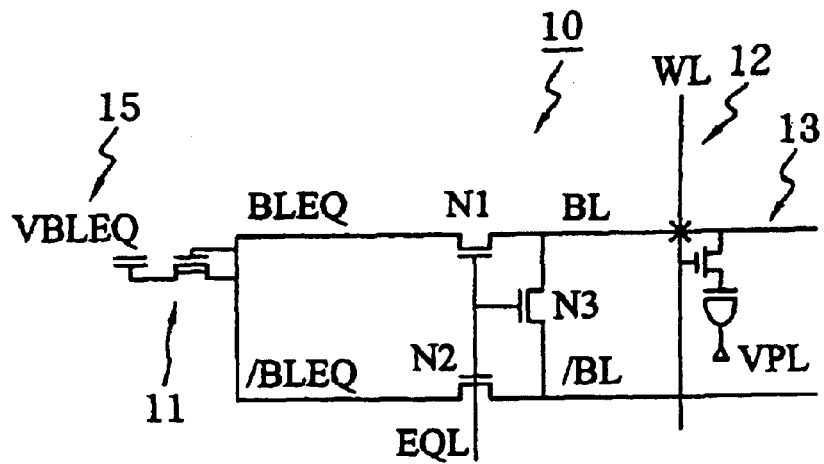
FIG. 1 shows a prior art standby current reduction circuit for DRAM.
Figure 2A:
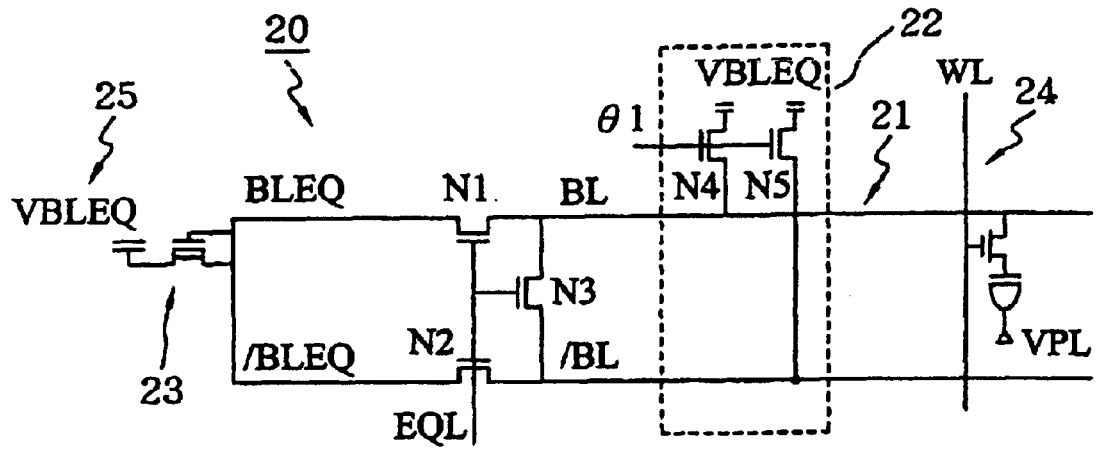
FIG. 2(a) shows an embodiment for the pre-charge circuit and its combination applied for the standby current reduction circuit of DRAM according to the present invention.

FIG. 2(a) shows an embodiment for the pre-charge circuit and its combination according to the present invention applied for the standby current reduction circuit for DRAM. The embodiment is to add a pre-charge circuit 22 between the pair of complementary bit lines 21 so as to provide a larger pre-charge current in the operating mode. Relatively, the pre-charge current required by the current-limiting means 23 can be reduced. The pre-charge circuit 22 comprises two transistors N4 and N5 in parallel connection and the control signal $\theta_1$ is used for controlling if the source of pre-charge voltage (VBLEQ) is to be connected to the pair of complementary bit lines 21. The control signal $\theta_1$ is enabled in the operating mode and disabled in the standby mode. By the above-mentioned structure, the leakage current caused by the short circuit between the pair of complementary bit lines 21 and the word line in the standby mode can be greatly reduced. With the circuit according to the present invention, it can reduce the leakage current problem in standby mode resulting from the defects in manufacturing processes and satisfy the product requirement of a low power DRAM.

Figure 2B:
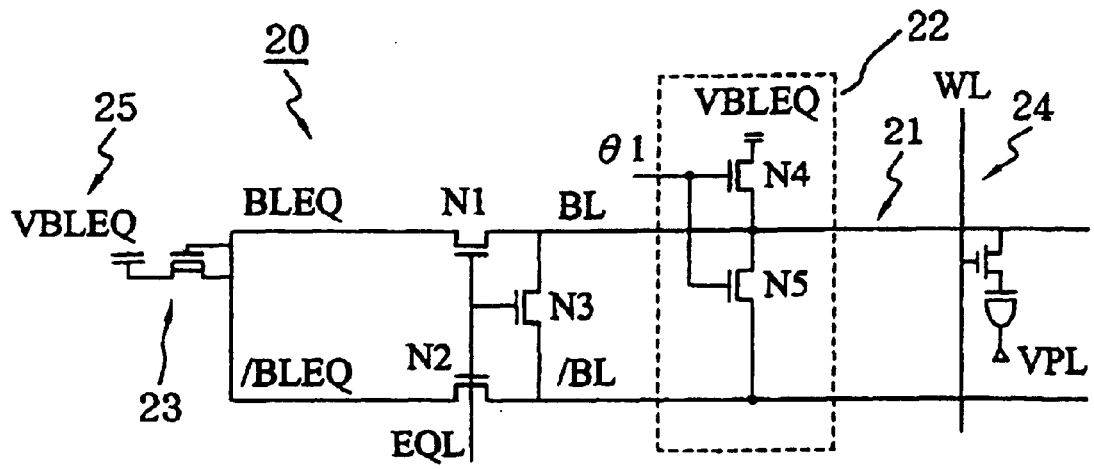
FIG. 2(b) shows another embodiment for the pre-charge circuit and its combination applied for the standby current reduction circuit of DRAM according to the present invention.

FIG. 2(b) shows another embodiment according to the present invention. The pre-charge circuit 22 comprises two transistors N4 and N5 in serial connection and the control signal $\theta_1$ is used for controlling if the source of pre-charge voltage (VBLEQ) is to be connected to the pair of complementary bit lines 21. The control signal $\theta_1$ is enabled in the operating mode and disabled in the standby mode. Because the pre-charge circuit 22 is used to provide a larger pre-charge current in the operating mode, it can relatively reduce the pre-charge current required by the current-limiting means 23. Based on the above-mentioned structure, the leakage current in the standby mode caused by the short circuit between the pair of complementary bit lines 21 and the word line 24 can be greatly reduced.

Figure 3:
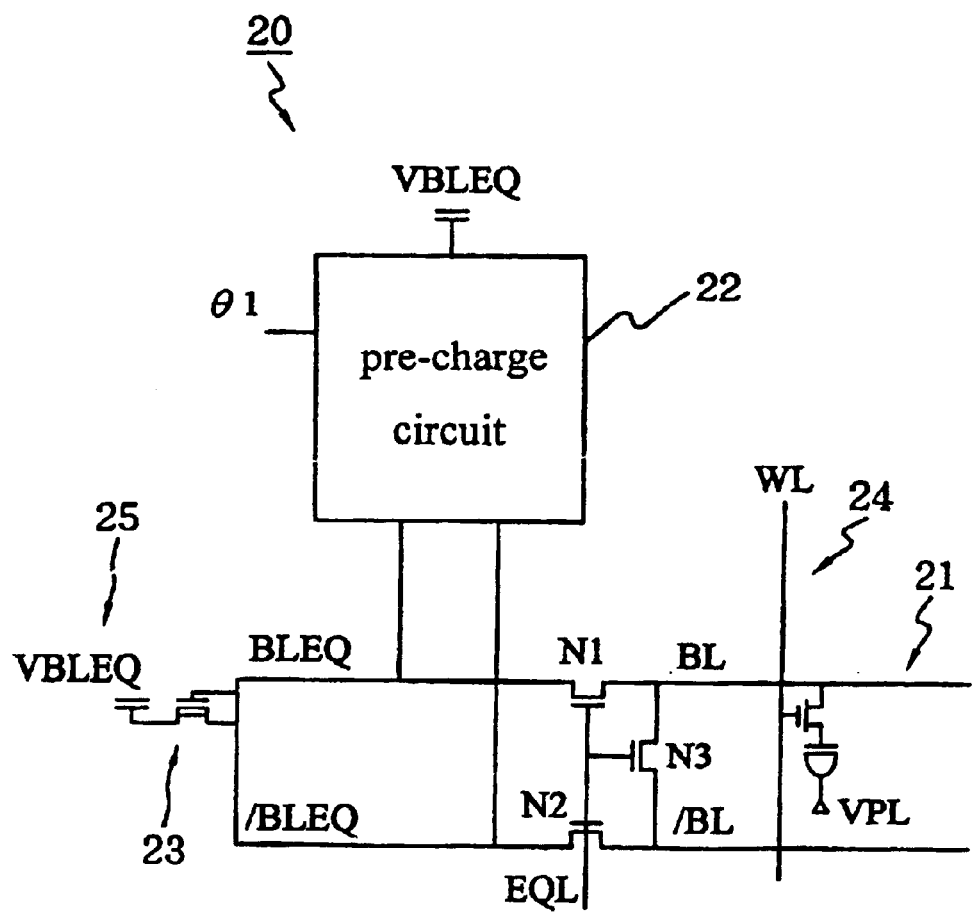
FIG. 3 shows another embodiment for the pre-charge circuit and its combination applied for the standby current reduction circuit of DRAM according to the present invention.

FIG. 3 shows another embodiment according to the present invention. The pre-charge circuit 22 can be connected to both ends (BLEQ and /BLEQ) of the current-limiting means 23 and the control signal $\theta_1$ is used to control if the source of pre-charge voltage (VBLEQ) is connected. The control signal $\theta_1$ is enabled in the operating mode and disabled in the standby mode. Because the pre-charge circuit 22 is used to provide a larger pre-charge current in the operating mode, it can relatively reduce the pre-charge current required by the current-limiting means 23 to supply. Based on the above-mentioned structure, the leakage current in the standby mode caused by the short circuit between the pair of complementary bit lines 21 and the word line 24 can be greatly reduced.

The above-described embodiments of the present invention are intended to be illustrative only. Numerous alternative embodiments may be devised by those skilled in the art without departing from the scope of the following claims.

What is claimed is:

1. A standby current reduction circuit applied in DRAM, comprising:
   a pre-charge circuit electrically connected to a pair of complementary bit lines of said DRAM for providing a pre-charge current only in an operating mode; and
   a current-limiting means for providing a smaller pre-charge current to said pair of complementary bit lines;
   whereby, when said pre-charge circuit is not providing said pre-charge current, said smaller pre-charge current provided by said current-limiting means reduces leakage current from said pair of complementary bit lines.

2. The standby current reduction circuit of claim 1, wherein said pre-charge circuit comprises a plurality of transistors in parallel connection.

3. The standby current reduction circuit of claim 1, wherein said pre-charge circuit comprises a plurality of transistors in serial connection.

4. The standby current reduction circuit of claim 1, wherein said pre-charge circuit is directly electrically connected to said pair of complementary bit lines of said DRAM.

5. The standby current reduction circuit of claim 1, wherein said pre-charge circuit is electrically connected to an output terminal of a conductive path between said current-limiting means and said pair of complementary bit lines of said DRAM.

6. A standby current reduction circuit applied in DRAM, comprising a plurality of word lines, a plurality of pairs of complementary bit lines, a plurality of pre-charge equalizing circuits and a plurality of current-limiting means, characterized in that a pre-charge circuit is added between each pair of said complementary bit lines, and said pre-charge circuit provides a pre-charge current only in an operating mode so as to reduce a leakage current in a standby mode due to a short circuit between said pair of complementary bit lines and word line of DRAM.

7. The standby current reduction circuit of claim 6, wherein said pre-charge circuit is directly electrically connected to said pair of complementary bit lines of said DRAM.

8. The standby current reduction circuit of claim 6, wherein said pre-charge circuit is electrically connected to an output terminal of a conductive path between said current-limiting means and said pair of complementary bit lines of said DRAM.

* * * * *